United States Patent
Wang (10) Patent No.: US 6,743,342 B2
(45) Date of Patent: *Jun. 1, 2004

(54) SPUTTERING TARGET WITH A PARTIALLY ENCLOSED VAULT

(75) Inventor: Wei Wang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/096,168

(22) Filed: Mar. 12, 2002

(65) Prior Publication Data

US 2003/0173215 A1 Sep. 18, 2003

(51) Int. Cl.[7] .............................................. C23C 14/35
(52) U.S. Cl. ..................... 204/298.12; 204/298.11; 204/298.18; 204/298.19; 204/298.2; 204/298.21
(58) Field of Search ................. 204/298.12, 298.11, 204/298.17, 298.18, 298.19, 298.2, 298.21

(56) References Cited

U.S. PATENT DOCUMENTS

| 5,069,770 | A | * | 12/1991 | Glocker ................. 204/192.12 |
| 5,178,743 | A | * | 1/1993 | Kumar .................. 204/298.21 |
| 5,482,611 | A | * | 1/1996 | Helmer et al. ......... 204/298.17 |
| 6,193,854 | B1 | | 2/2001 | Lai et al. ............... 204/192.12 |
| 6,217,716 | B1 | * | 4/2001 | Fai Lai .................. 204/192.12 |
| 6,251,242 | B1 | * | 6/2001 | Fu et al. ................ 204/298.19 |
| 6,277,249 | B1 | * | 8/2001 | Gopalraja et al. ..... 204/192.12 |
| 6,337,001 | B1 | * | 1/2002 | Haag et al. ............. 204/192.2 |
| 6,406,599 | B1 | * | 6/2002 | Subramani et al. .... 204/298.09 |

FOREIGN PATENT DOCUMENTS

| EP | 1119017 | * | 7/2001 |
| JP | 02-004966 | * | 1/1990 |
| JP | 05-070945 | * | 3/1993 |

* cited by examiner

Primary Examiner—Rodney G. McDonald
(74) Attorney, Agent, or Firm—Charles S. Guenzer, Esq.

(57) ABSTRACT

A sputtering target having an annular vault with a throat between two sidewalls and facing a substrate to be sputter coated. The vault is partially closed by a plate placed in the annular throat between the sidewalls. Thereby, the plasma density is increased within the vault. Furthermore, the position of the annular gap in the plate between the two sidewalls may be chosen to increase uniformity of sputtering deposition arising from the two sidewalls. The plate may be formed of one or more annular rings attached to the walls or a single plate having apertures formed therein may bridge the throat. Alternatively, the target may be formed as a cylindrical hollow cathode with the plate partially closing the circular throat. A rotating asymmetric roof magnetron may be combined with a hollow cathode without the restricting plate.

35 Claims, 6 Drawing Sheets

SPUTTERING TARGET WITH A PARTIALLY ENCLOSED VAULT

FIELD OF THE INVENTION

The invention relates generally to plasma sputter reactors. In particular, the invention relates to complexly shaped sputter targets.

BACKGROUND ART

Sputtering, alternatively called physical vapor deposition (PVD), is the most prevalent method of depositing layers of metals and related materials in the fabrication of semiconductor integrated circuits. Most commercial sputter reactors rely upon magnetron sputtering in a plasma reactor. The most common commercial sputter reactor is a magnetron sputter reactor in which a metal target of the material to be sputter deposited is placed in opposition to the wafer to be sputter coated. The vacuum chamber containing the wafer and target is filled with a few milliTorr of argon. The target is then electrically biased to a few hundred volts DC, which excites the argon into a plasma. The resulting positively charged argon ions are attracted to the negatively biased target and dislodge (sputter) metal atoms from the target. Some of the metal atoms fall on the wafer and coat a thin metal layer on it. Typically, a set of magnets, called a magnetron, is placed in back of the target to create magnetic field lines parallel to the front face of the target, thereby trapping electrons and increasing the plasma density adjacent the target and thus increasing the sputtering rate. In reactive sputtering, a reactive gas such as nitrogen is also admitted to the chamber, and the reactive gas reacts with the sputtered metal atoms to form a metal compound, such as a metal nitride, on the wafer surface.

The older, conventional magnetron sputter reactors produce a relatively low-density plasma of the argon ions and, as a result, the sputtered metal atoms are mostly neutral, only a few percent of them being ionized. It has become recognized in recent years that a higher fraction of metal ions would be very beneficial, particularly for coating the sides and bottoms of holes having high aspect ratios. Such holes may be via or contact holes or may be DRAM trenches. The mostly ballistic sputtering process described to this point is ill suited for reaching into holes having aspect ratios significantly larger than one at the same time that vias of modern integrated circuits often have aspect ratios of 5 and greater. However, it has been recognized that a negatively biased wafer can accelerate metal ions in the direction normal to the wafer surface, thereby draw the sputtered metal ions deep into the hole.

Generally, increasing the density of the argon plasma increases the ionization fraction of the sputtered atoms. Several approaches have been used to produce a high density plasma. In one approach, additional RF energy is inductively coupled into a plasma source region remote from the wafer. In a second approach, often called a hollow cathode reactor, a non-planar target surrounds the top and sides of a plasma region adjacent the target, thereby reducing the plasma loss and increasing the plasma density. In a third approach, often called self-ionized plasma (SIP) sputtering, a small intense magnetron concentrates the target power in a reduced area, thereby increasing the power density and hence increasing the plasma density adjacent to the magnetron. The small magnetron is scanned around the target to produce more uniform sputtering.

Figure 1:
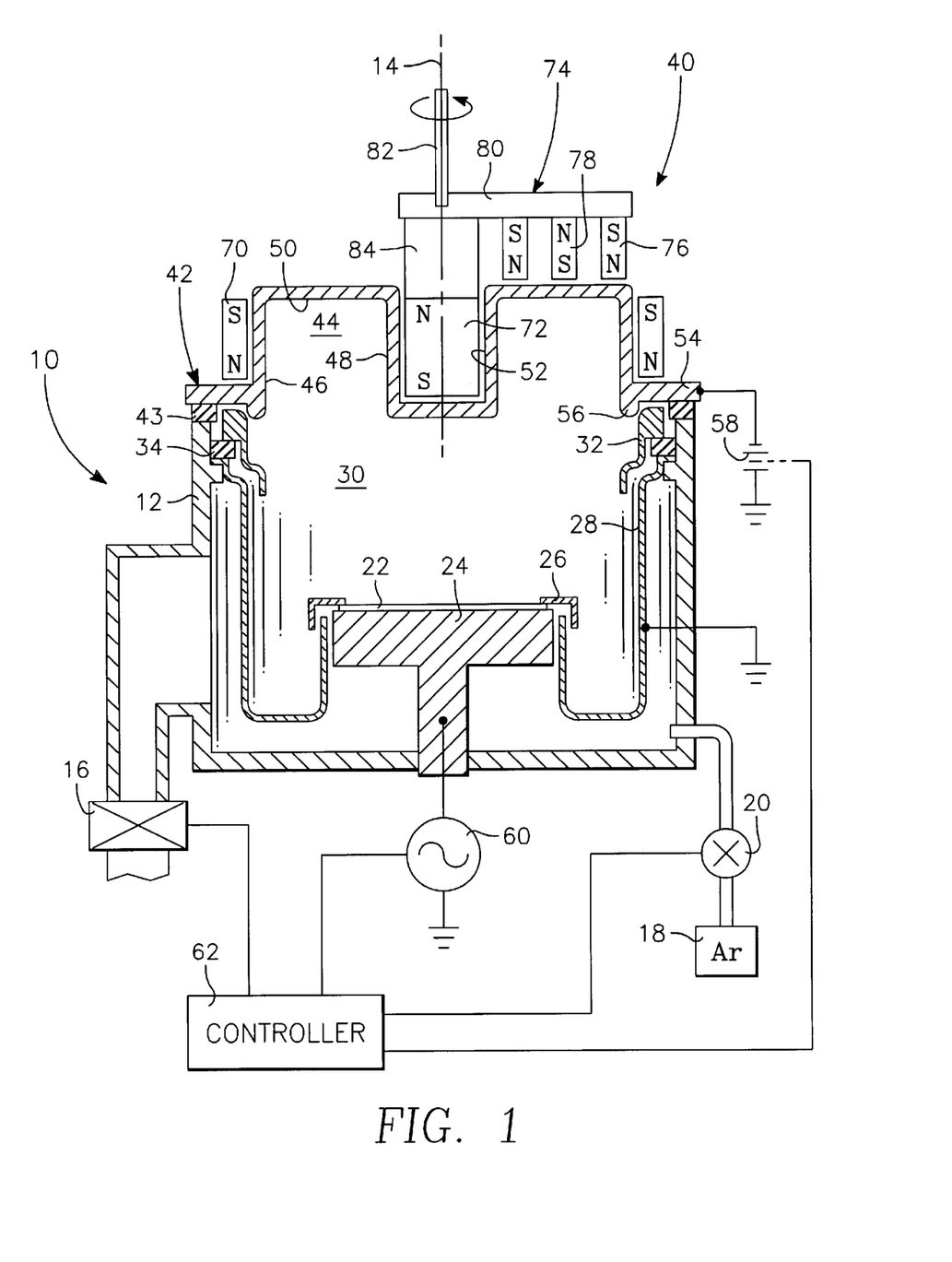
FIG. 1 is a schematic cross-sectional view of a magnetron sputter reactor including an annularly vaulted target.

An advanced sputter reactor that advances on the second and third approach is the SIP+ sputter reactor marketed by Applied Materials, Inc. of Santa Clara, Calif. and schematically illustrated in FIG. 1. Reactors of this type have been described by Gopalraja et al. in U.S. Pat. No. 6,277,249 and U.S. patant application, Ser. No. 09/703,601, filed Nov. 1, 2000 and now issued as U.S. Pat. No. 6,451,177, both of which are incorporated by reference herein in their entireties. The lower part of the reactor 10 includes an electrically grounded chamber including sidewalls 12 generally symmetric about a central axis 14. A vacuum pumping system 16 reduces the base pressure within the chamber to the neighborhood of $10^{-8}$ Torr. However, working gas is supplied from an argon source 18 through a mass flow controller 20 to maintain the argon pressure in a range of 0.1 to 10 milliTorr. If a nitride film is being formed by reactive sputtering, nitrogen is additionally supplied.

A wafer 22 to be sputter coated is supported on a temperature controlled pedestal electrode 24. The wafer 22 may be secured to the pedestal electrode 24 by a clamp ring 26, but an electrostatic chuck may alternatively be used. A grounded shield 28 supported on the sidewalls 12 protects the chamber walls and sides of the pedestal 24 from being coated with sputtered material and further acts as a cathode for the diode sputtering process. The argon working gas is admitted into a processing space 30 over the wafer 22 through gaps between the pedestal 24, the wafer clamp 26, and the grounded shield 28. The high density plasma being generated benefits from an electrically floating shield 32 supported on the grounded shield 28 through an isolator 34.

The SIP+ reactor 10 is most visibly distinguished by a target and magnetron assembly 40 including a vault-shaped target 42 supported on the chamber sidewalls 12 through a second isolator 43. The target 42 is composed of the metal to be sputtered. Copper sputtering is the most prevalent initial use of the SIP+ reactor 10, but other metals can be used in the target 42. The vault-shaped target 42 includes an annular vault 44 extending around the central axis 14 with its open end or throat facing the wafer 22. The vault 44 includes an outer sidewall 46, an inner sidewall 48, both extending generally parallel to the central axis 14, and a roof 50 extending generally perpendicular to the central axis 14. A central well 52 is formed on the back of the target 42 inside the annular inner sidewall 48. The target 42 is supported on the isolator 43 by an outwardly extending flange 54. A projection 56 extending downwardly from the outer sidewall 46 forms a plasma dark space in opposition to the floating shield 32.

A DC power source 58 electrically biases the target 42 to a negative voltage of about −600 VDC with respect to the grounded shield 28. This voltage is sufficient to maintain an argon plasma within the processing space 30. If a substantial fraction of the sputtered atoms are ionized, it is advantageous to induce a negative DC bias on the pedestal electrode 24 by biasing it with an RF power supply 60 connected to the pedestal electrode 24 through an unillustrated capacitive coupling circuit. A controller 62 controls the sputtering process and may be programmed for a multi-step process according to which it separately controls the chamber pressure, target power and wafer bias.

In magnetron sputtering, magnets are positioned in back of the target 42 to increase the plasma density adjacent to the face of the target 42. The SIP+ target and magnetron assembly 40 includes both stationary and rotating magnetic parts. The stationary part includes a large number of permanent magnets 70 of a first vertical polarity arranged around the outside of the outer vault sidewall 46. A cylindrical magnet 72 of an opposite second vertical polarity is disposed within the vault well 52 behind and inside the vault inner sidewall 48. Although the cylindrical magnet 72 is rotating for reasons relating to unillustrated target cooling, its magnetic field is essentially stationary. The two sets of magnets 70, 72 create anti-parallel magnetic fields close to interior sides of the vault 44 adjacent the opposed sidewalls 46, 48. The rotating part includes a nested magnetron 74 positioned over the vault roof 50 and including an outer annular magnet 76 of the first magnetic polarity surrounding an inner cylindrical magnet 78 of the second magnetic polarity. The nested magnetron 74 is unbalanced in that the total (spatially integrated) magnetic flux produced by the outer magnet 76 is at least 50% larger than that produced by the inner magnet 78.

The roof magnetron 74 is supported on a magnetic yoke 80 fixed to a shaft 82 extending along the central axis 14 and rotated by an unillustrated motor so as to sweep the roof magnetron 14 along the circumference of the roof 50 of the target vault 44. The inner sidewall magnet 72 is also supported through a non-magnetic spacer 84 connected to the shaft 82 although this rotation is not immediately pertinent to the physics of the sputtering process.

The described magnetron in conjunction with the annularly vaulted target offers many advantages. The vault creates a region closed on three sides so that plasma leakage out of the sputtering region is minimized and the plasma density is increased. The magnetic field components running parallel to the target sidewalls 46, 48 and to the roof 50 further increase the plasma density near the target areas being sputtered. The relatively small roof magnetron 74 concentrates the sputtering in the area of the vault 44 over which the roof magnetron is passing, thus concentrating the limited target power there and increasing the target power density. Sputtering into high aspect-ratio holes is facilitated by a large fraction of ionized sputtered metal particles which can be attracted into the holes by biasing the wafer. The SIP+ reactor is believed to be capable of a metal ionization fraction of about 50%. The combination of a stationary distributed magnetic field and a rotating localized magnetic field allows the magnetron to operate in two distinct sputtering modes, believed to be associated with sputtering around the entire annular vault and with sputtering in the area of the roof magnet.

Nonetheless, the SIP+ reactor could be further improved. In at least some applications, particularly those involving extreme aspect ratios of ten and more, it is desired to further increase the ionization fraction since any neutral sputter component is approximately isotropic, a cosine distribution off the normal between the target and wafer being assumed. As mentioned before, SIP+ sputter reactors as presently implemented seem to be limited to about a 50% metal ionization fraction. The ionization rate in SIP+ reactors is practically limited by the plasma density produced by the still relatively low target power. The localized sidewall and magnetic field confinement still allows excessive plasma leakage from the high-density plasma region.

Figure 2:
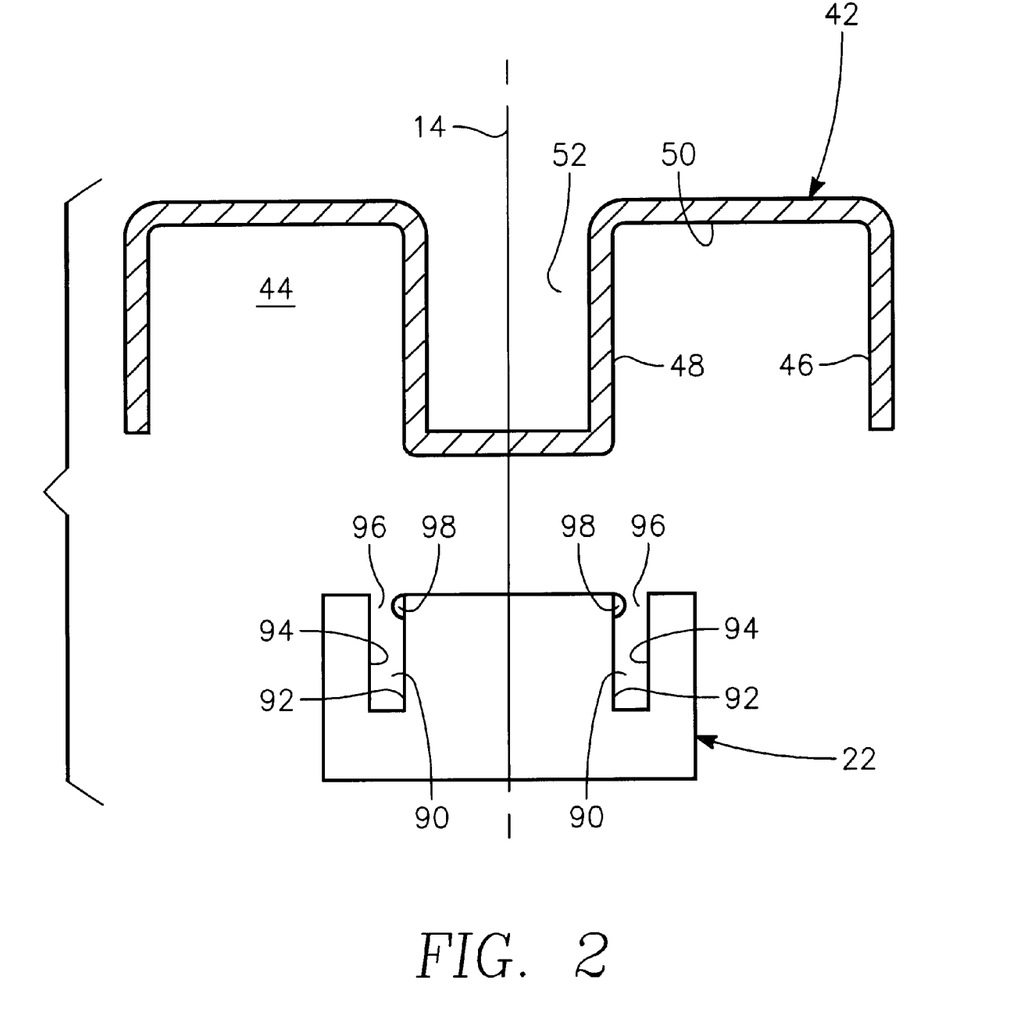
FIG. 2 is a cross-sectional view illustrating the asymmetric deposition produced by a prior annularly vaulted target.

Although SIP+ targets provide relatively good sputtering uniformity, the sputtering uniformity on sidewalls across the wafers could be improved. The geometry of the target 42 and the wafer 22 with its high aspect-ratio holes 90 is illustrate in the cross-sectional view of FIG. 2 The holes 90 will hereafter be referred to as vias because this type of vertical connection through an inter-level dielectric between two metallization levels is a major application. The thickness of the wafer 22 is greatly exaggerated, but the geometry of the vias 90 is approximately correct. It has been observed that the minimum target erosion occurs at the outer vault sidewall 46. That is, the greatest sputtering rate occurs at the outer sidewall 46. In the usual configuration, the diameter of the wafer 22 generally extends from appoximately one side to the other of the middle of the annular vault 44. If the vias 90 are located near the periphery of the wafer 22, this geometry exposes the hole inner sidewall 92 of the full brunt of the target sidewall sputtering. As a result, the inner hole sidewall 92 is subject to a larger flux of neutral target atoms than is the outer hole sidewall 94. This differential flux tends to form an overhang 98 on the inside hole rim 96, which has the possibility of closing off the hole 90. Other geometries may favor inner sidewall deposition. Sidewall coverage is critical for formation of a thin copper seed layer. To minimize seed deposition times and prevent premature via closure, the sidewall deposition should be uniform across the wafer.

The annularly vaulted target is related to a well known hollow-cathode target, for example, that described by Lai et al. in U.S. Pat. No. 6,193,854 and by Lai in U.S. Pat. No. 6,217,716 although significant differences exist in both the geometry and effect of the magnetic fields. Such a hollow-cathode includes a single cylindrical vault arranged about the chamber axis and having a tubular sidewall and a roof bridging the sidewall. The cited references describe several magnet configurations. The hollow cathode is in turn related to an effusion cell or partially closed hollow sputtering target, such as that described by Glocker in U.S. Pat. No. No. 5,069,770. In the effusion cell, the throat of the cylindrical hollow target facing the wafer is partially closed with a narrow opening at its symmetric center facing the wafer. The effusion cell can be likened to a black-body radiator in which an intense plasma develops within the cell's interior with only a relatively small portion leaking through the central aperture towards the wafer. This geometry does not address the problem of sidewall uniformity. Glocker's effusion cell is distinguished from a more conventional hollow cathode in that the effusion cell includes both an anode and a cathode within the target cavity.

SUMMARY OF THE INVENTION

A sputtering target having an annular vault arranged about its side facing the substrate being sputter coated. The throat of the vault is partially closed. The throat ring may be arranged adjacent the inner sidewall or the outer sidewall of the vault or adjacent both sidewalls so as to form a smaller annular throat. Alternatively, the throat ring may be formed with a circular arrangement of holes. The holes may be circular or circumferentially elongated, and they may be formed in multiple concentric circles.

The invention may also be applied to a hollow cathode target having a cylindrical vault.

The partially closed throat more effectively confines the plasma within the vault, thereby increasing the plasma density and the ionization fraction of sputtered atoms.

DESCRIPTION OF THE PREFERRED EMBODIMENTS

Figure 3:
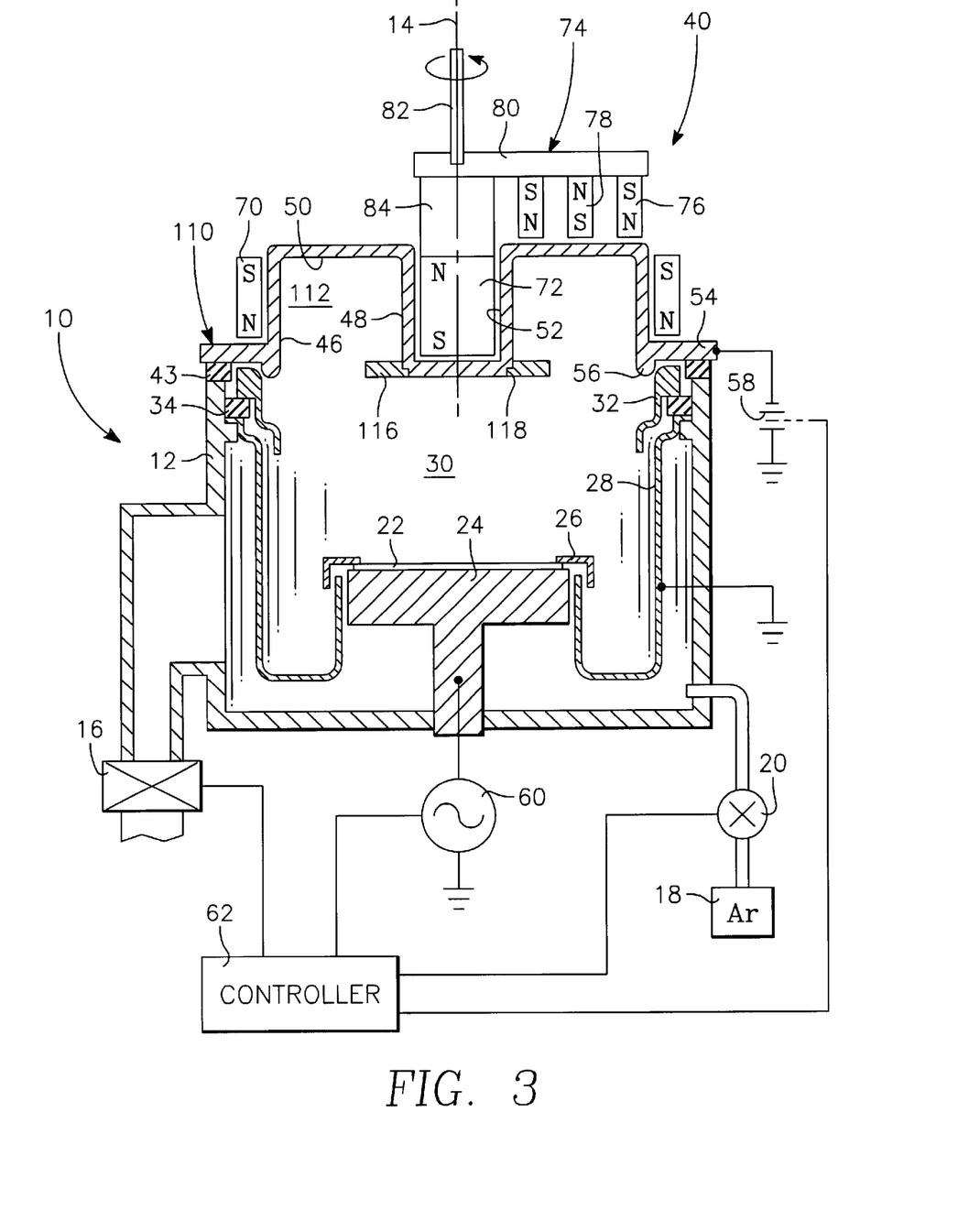
FIG. 3 is a schematic cross-sectional view of a magnetron sputter reactor in accordance with the invention including a first embodiment of a partially enclosed annularly vaulted target.
Figure 4:
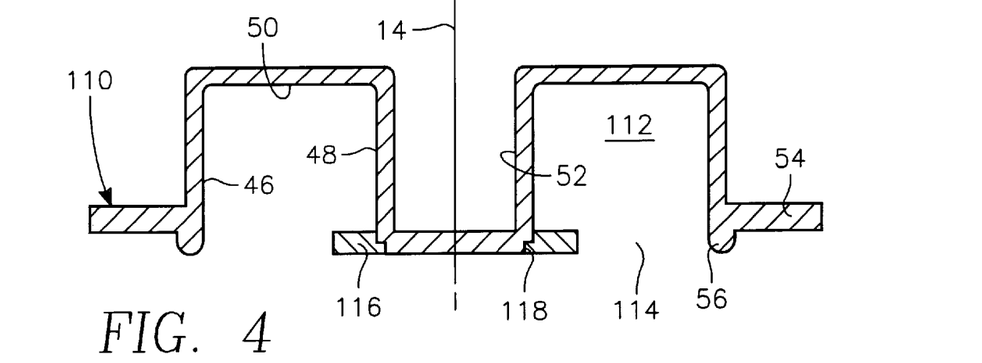
FIG. 4 is a cross-sectional view of the first embodiment of the partially enclosed annularly vaulted target.

In one embodiment of the invention illustrated in the cross-sectional view of the entire reactor 40 in FIG. 3 and in the more detailed cross-sectional view of an inventive target 110 in FIG. 4, the target 110 includes an annularly arranged vault 112 similar to the vault 44 of FIG. 1. However, an annular outerly radially extending portion 116 of the target 110 partially closes the vault 112 at its bottom or throat 114 facing the wafer 22 and is electrically fixed to the remainder of the target 110. In this embodiment, the radially extending portion 116 is located on only one side, the radially inner side, of the throat 114. The radially extending portion 116 will be referred to as a throat ring 116, which in the illustrated embodiment produces an annular throat 114 that is symmetric about the center axis 14 but is radially asymmetric with respect to the two sidewalls 46, 48. The throat ring 116 is preferably composed of the same material as the rest of the target 110, for example, copper with less than 10 wt % of alloying elements such as silicon or magnesium Preferably, the throat ring 116 causes the throat 114 to have an area extending circumferentially around the vault 112 that is no more than two-thirds the area of a throat without the throat ring 116. More preferably, the area is no more than one-half the area with the throat ring 116. However, the size of the throat must be large enough to not significantly reduce the formation of the plasma in the vault 112. Although the magnetic confinement with the vault 112 intensifies the plasma there, it is also important that the argon plasma not be impeded from entering the vault 112. Therefore, the minimum dimension of the throat 114 should be at least as great as the argon mean free path at the operational pressure. The argon mean free path at 1 milliTorr is about 1 cm.

The restricted throat has several effects. When the throat ring is attached to the inner sidewall 48, the path between the inner sidewall 48 and the wafer being sputter coated is partially blocked, thereby reducing the preferential coating from the inner target sidewall 48 onto the outer via sidewalls of the wafer. The partial closing of the throat 114 also reduces the plasma loss out of the vault 112. In particular, the magnetic field lines closely parallel to the inner sidewall 48 may have both ends terminating on either the target roof 50 or the throat ring 116 so that electrons trapped on these field lines are confined to the vault 112. Thereby, the plasma density within the vault 112 is increased, and the ionization fraction of sputtered atoms is also increased.

The more conventional vaulted target 42 of FIG. 1 with the more open vault 44 can be easily formed by machining or forging. The inventive target 110 with a partially closed vault 112 is not so easily machined or forged. However, the target parts excluding the throat ring 116 can be machined or forged as a single piece. A separate annular throat ring 116 may be machined or otherwise formed and then permanently attached to the inner vault sidewall 48 by e-beam welding or other types of welding. Autogenous welding is preferred since the use of a non-copper filler (that is in the more general case, a material other than the composition of the target) will contaminate the target. Assembly and welding is facilitating by forming the throat ring 116 with a horizontally extending annular projection 118, which supports the unwelded ring 116 in an exposed position on a corresponding ledge of the inner sidewall 48 of the inverted target.

The target may be formed as an integral member by machining the throat ring from a wider sidewall. It is also possible to use screws, rivets, keys, force pins, or other fasteners to attach the throat ring to the sidewall. However, the fastening member is preferably made of the same material as the target.

Figure 5:
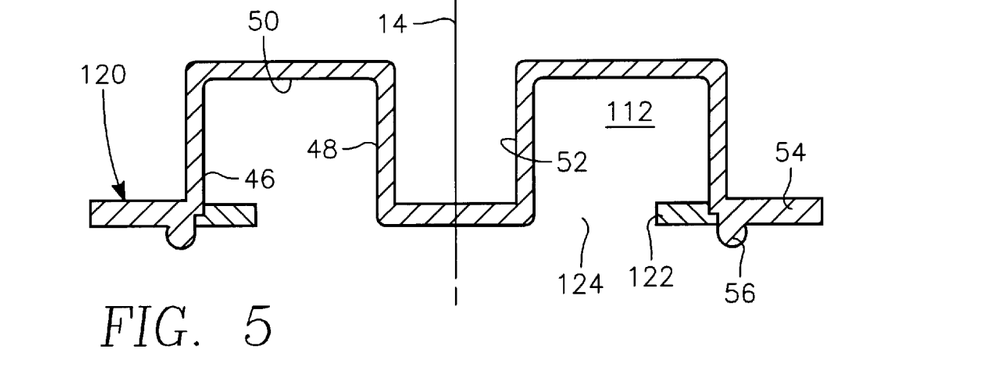
FIG. 5 is a cross-sectional view of a second embodiment of the partially enclosed annularly vaulted target.

A second embodiment of a vaulted target 120, illustrated in cross section in FIG. 5, includes a throat ring 122 fixed to and extending radially inwardly from the outer vault sidewall 46. This structure creates a reduced throat 124 asymmetrically located closer to the inner sidewall 48 than to the outer sidewall 48. As a result, the wafer is protected from particles sputtered from the outer sidewall 46 and decreases the formation of the lip 98, illustrated in FIG. 2, on the inner via sidewall 92.

Figure 6:
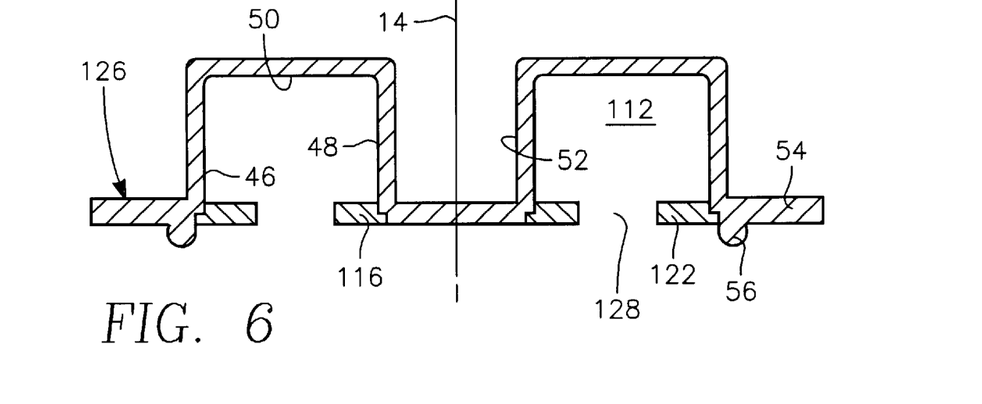
FIG. 6 is cross-sectional view of a third embodiment of the partially enclosed annularly vaulted target.

A third embodiment of a vaulted target 128, illustrated in cross section in FIG. 6, includes both the inner throat ring 116 attached to the inner sidewall 48 and the outer throat ring 122 attached to the outer sidewall 46. This structure creates a reduced annular throat 128 that is more centrally located. However, even if the throat 128 is symmetrically located between the two sidewalls 46, 48, the cylindrical geometry results in a non-symmetric sputtering pattern.

The various embodiments of the vaulted target of the invention may be used in combination with the magnetron illustrated in FIG. 3. However, other magnet distributions may be used. In particular, in view of the reduced plasma loss through the reduced-area throat, the close magnetic confinement afforded by the magnets of FIG. 3 may not be required. Instead, other and less confining magnetic field configurations may be used. For example, the sidewall magnetic fields may be parallel rather than anti-parallel, the roof magnets may be eliminated, or the sidewall magnets may be horizontally oriented in parallel and produce a fairly uniform radial field across the vault.

Figure 7:
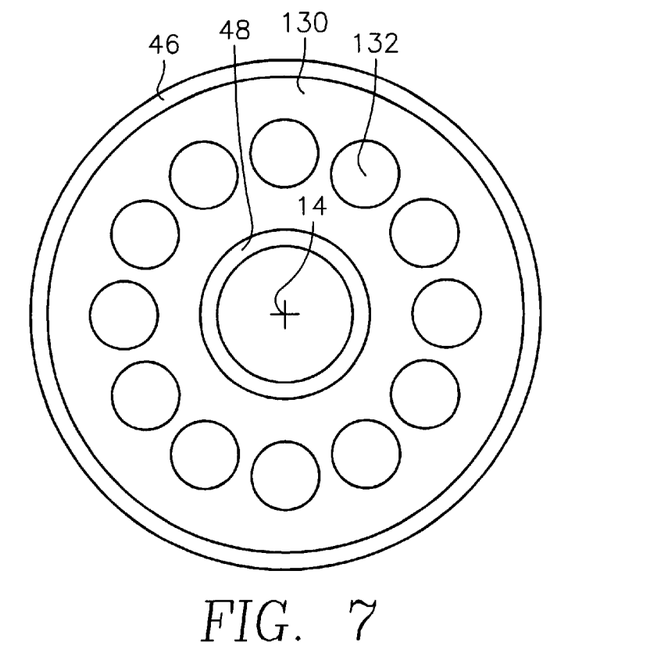
FIG. 7 is an axial plan view of a fourth embodiment including a perforated throat plate.

The plasma confinement can be further increased by utilizing a throat ring 130 illustrated in axial plan view in FIG. 7 having a plurality of apertures 132, for example circularly shaped apertures 132, distributed around the circumference of the target. Preferably, the number of apertures is eight or greater, more preferably at least twelve or sixteen. The throat ring 130 underlies the target vault 112 and is fixed to both the outer and inner sidewalls 46, 48. Such a throat ring 130 introduces some difficulties in uniform sputtering deposition but greatly increases the plasma density within the vault. The uniformity can be increased by forming the apertures 132 in more rectangular arc shapes, in which case the number of apertures may be decreased.

Figure 8:
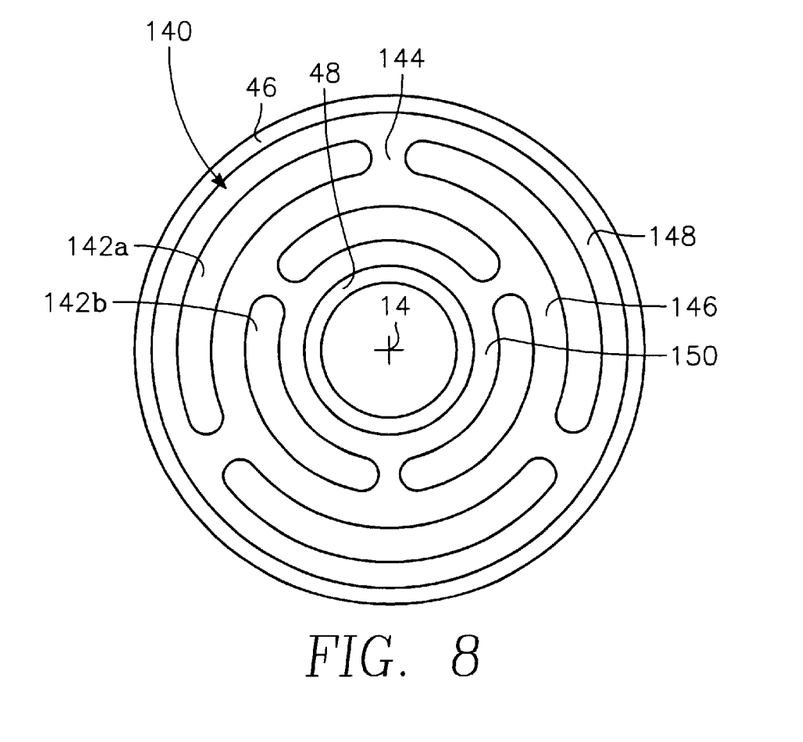
FIG. 8 is an axial plan view of a fifth embodiment including a throat plate with multiple rings of perforated segments.

Another variation illustrated in axial plan view in FIG. 8 includes a plurality of elongated arc-shaped segments 142a, 142b arranged in multiple circles. Within each circle, the plural segments 142a, 142b are separated by struts 144, preferably offset between different circles. The circles are separated by a circular band 146 and are surrounded by other circular bands 148, 150 respectively adjacent the outer and inner sidewalls 46, 48. The bands 146, 148, 150 more closely confine the plasma inside the vault. The width of the segments 142a, 142b is chosen to be wide enough to first be larger than a plasma dark space and secondly to assure that the sputtering occurs within the vault and not predominantly on the exposed face of the throat ring 140. The second condition requires that the throat be wide enough that the throat ring not ground out the plasma and prevent a plasma depletion zone from forming within the vault. However, the sputtering rate is largely controlled by the magnetic field parallel to the target face. This field is configured to be much larger inside the vault than on the exposed throat ring. A combination of the embodiments of FIGS. 7 and 8 includes a single ring of arc-shaped segments 142a.

Although the invention has been described with respect to an annular vault with a generally rectangular cross section formed by parallel sidewalls and a roof, other vault shapes are possible. For example, the vault may be shaped as a partial toroid, as a triangle, or as a truncated triangle with the base partially closed by the throat plate.

Furthermore, although the invention has been developed for the annular vault of the SIP+ sputter reactor, some aspects of the invention can be applied to a cylindrical vault, similar to the hollow cathode target of Lai et al. As illustrated in the cross-sectional view of FIG. 9, a constricted hollow cathode 160 includes a conventionally shaped principal hollow cathode target 162 having a disc-shaped top wall 164 and a tubular sidewall 166 arranged about a central axis 168 to define a cylindrical vault 170. An annular throat ring 172 is mechanically and electrically fixed to the bottom of the target sidewall 166 opposite the top wall 164 to define a restricted throat 174 into the vault 170. The area of the restricted throat 174 is preferably no more than two-thirds that of the full throat defined between the sidewall 166, and more preferably no more than half.

Figure 9:
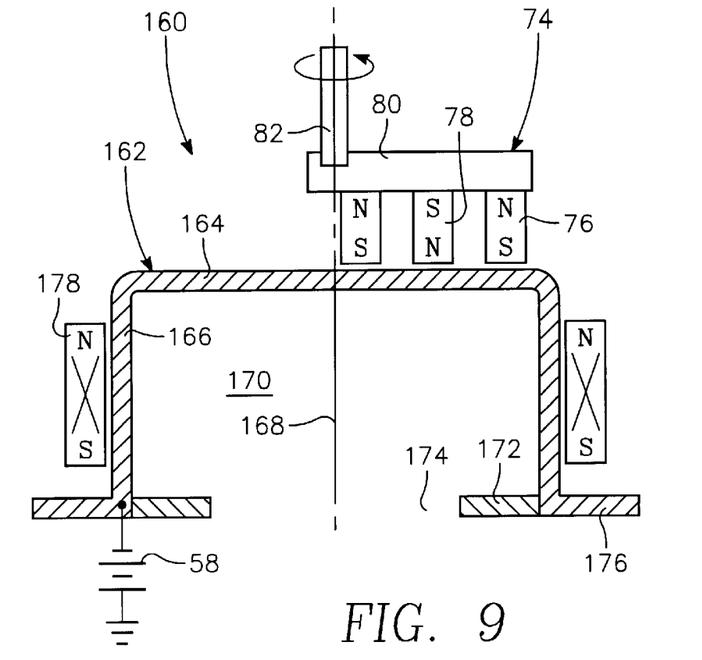
FIG. 9 is a cross-sectional view of a partially enclosed hollow cathode target.

A flange 176 extending radially outwardly from the bottom of the sidewall 166 may be used to support the target 162 on the chamber body. However, the throat ring 172 may be used for the same purpose. The relative axial positions of the throat ring 172 and flange 176 may be varied.

A tubular sidewall magnet assembly 178 is arranged around the outside of the sidewall 166 and has a first magnetic polarity along the central axis 168. The magnet assembly 178 may consist of a single tubular magnet or a set of similarly magnetized cylindrical magnets arranged in a circle. If the sidewall magnet assembly 178 surrounds only a central portion of the target sidewall 166 or more generally does not extend along the bottom portion of the sidewall 166, its magnetic field is largely confined to within the vault 170, thereby creating a strong magnetic field parallel to the target sidewall 166 and minimizing plasma loss out of the vault 170.

Figure 10:
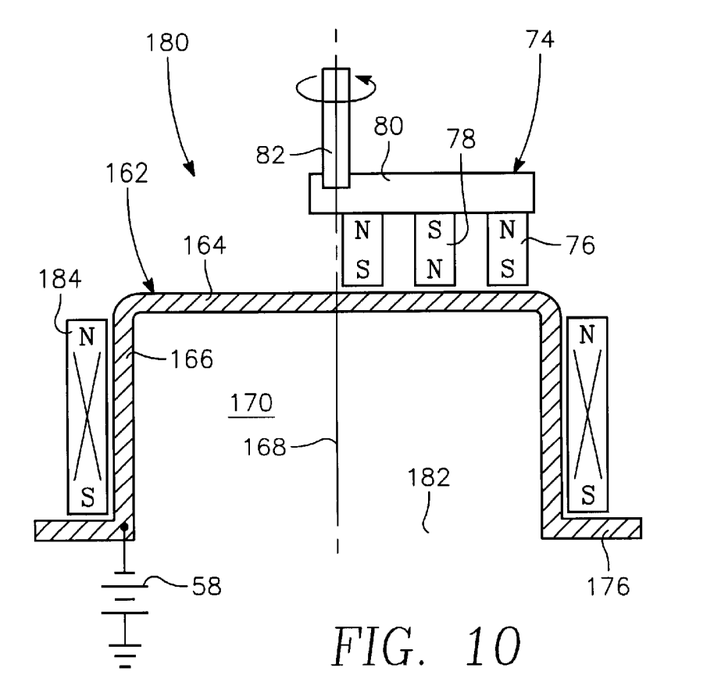
FIG. 10 is a cross-section view of a fully open hollow cathode target having a rotating roof magnet.

It may be advantageous to additionally include a small rotating roof magnetron 74 asymmetric with respect to the central axis 182 about which it rotates, as has been described with reference to FIG. 3. If the magnetron 74 is unbalanced and the magnetic polarity of the outer magnet ring 76 is the same as that of the sidewall magnet assembly 178, a very strong magnetic field is created at the top corner between the roof 164 and the sidewall 166. This effect as well as the localized high-density plasma produced by the roof magnetron are advantageously obtained in an open-throated hollow cathode 180 illustrated in FIG. 10 which lacks the throat ring 172, thereby resulting in an unrestricted or open throat 182. Also in this case, an elongated tubular magnet assembly 184 may extend along most of the vault sidewall 184 and particularly its bottom to better achieve Lai's magnetic null at a location below the non-occluded throat 182.

Other forms of the roof magnetron may be used, including balanced magnetrons and magnetrons formed of two bands of opposed poles. Nonetheless, with or without the roof magnetron 74, the constricted throat 174 of FIG. 9 better confines the plasma to the vault 170 and thereby increases the plasma density and ionization fraction.

Although the invention has been described with respect to the important application of copper deposition, other metal and metal compounds may be deposited using the novel target of the invention. Aluminum metallization is well known. Refractory metals such as tungsten, titanium, molybdenum, and cobalt are used in metallizing vias and other structures. Refractory nitrides are deposited by using a refractory metal target and a nitrogen ambient.

The plasma confinement within the partially closed vault relaxes the need for magnetic confinement. As a result, other magnetic configurations may be used. In one modification, the rotating nested roof magnetron may not be needed to achieve a satisfactorily high plasma density, thereby greatly simplifying the magnetron design. In another modification, the sidewall magnets may have the same vertical polarity or may be arranged horizontally to produce a radial magnet field across the vault.

The invention thus allows a significant increase in the capability of a vaulted target with only a small increase in the target's complexity.

What is claimed is:

1. A vault shaped sputtering target, comprising:
a principal target comprising a material to be sputtered in opposition to a substrate to be sputter deposited and including two opposed annularly shaped sidewalls extending parallel to a central axis and a roof extending perpendicular to said central axis and together forming an annular vault, wherein said material is continuous within said vault and has a shape not allowing different biasing voltages on different parts of said material; and
an annular plate comprising said material partially closing a throat of said vault on a side of said vault facing said substrate and mechanically and electrically fixed to said principal target.

2. The target of claim 1, wherein said annular plate closes an area of said throat by at least 33%.

3. The target of claim 2, wherein said annular plate closes said area of said throat by at least 50%.

4. The target of claim 1, wherein said annular plate forms at least one aperture in said throat having a minimum dimension of at least 1 cm.

5. The target of claim 1, wherein said annular plate is fixed to an inner one of said sidewalls and forming an annular gap between said annular plate and an outer one of said sidewalls.

6. The target of claim 1, wherein said annular plate is fixed to an outer one of sidewalls and forming an annular gap between said annular plate and an inner one of said sidewalls.

7. The target of claim 1, wherein said annular plate is a first annular plate detachably fixed to an inner one of said sidewalls and further comprising a second annular plate detachably fixed to an outer one of said sidewalls with an annular gap formed between said first and second annular plates.

8. The target of claim 1, wherein said annular plate is fixed to both of said sidewalls and including a plurality of apertures formed therethrough in an area of said throat of said vault.

9. The target of claim 8, wherein there are at least eight of said apertures distributed along a circumference of said annular plate.

10. The target of claim 1, wherein said sidewalls, said roof, and said annular ring are mechanically and electrically fixed together.

11. A vault shaped sputtering target, comprising:
a principal target comprising a material to be sputtered in opposition to a substrate to be sputter deposited and including a cylindrically shaped sidewall and a continuous disk shaped roof forming therebetween as a continuous body a cylindrical vault facing said substrate and not allowing a differential voltage to be formed between portions of said vault; and
an annular plate comprising said material partially closing a throat of said vault.

12. The target of claim 11, wherein said annular plate closes an area of said throat by at least 33%.

13. The target of claim 11, wherein said annular plate is mechanically and electrically fixed to said principal target.

14. The target of claim 11, wherein said annular plate forms at least one aperture in said throat having a minimum dimension of at least 1 cm.

15. A vault shaped sputtering target, comprising:
a principal target comprising a material to be sputtered in opposition to a substrate to be sputter deposited and including a cylindrically shaped sidewall and a disk shaped roof forming therebetween a cylindrical vault facing said substrate; and
an annular plate comprising said material partially closing a throat of said vault, wherein said annular plate includes a plurality of apertures therethrough in said throat.

16. The target of claim 15, wherein said apertures have respective minimum dimensions of at least 1 cm.

17. A magnetron sputter reactor, comprising:
a vacuum chamber arranged about a central axis;
a pedestal electrode for supporting a substrate to be sputter coated;
an RF power supply connectable to said pedestal electrode for inducing a negative self-bias thereupon;
a sputtering target in opposition to said pedestal and including at least one sidewall and a roof forming a vault symmetric about said central axis and having a throat facing said target;
a power supply selectively biasing said target to a negative DC voltage;
a least one magnet disposed in back of said at least one sidewall;
a grounded shield disposed adjacent to walls of said vacuum chamber to act as an electrode with respect to said target for creating a plasma between said shield and said target; and
an annular plate positioned adjacent to and partially closing said throat and electrically fixed to said target.

18. The reactor of claim 17, wherein said plate is detachably affixable to said sidewall.

19. The reactor of claim 17, wherein said vault is annular.

20. The reactor of claim 19, wherein said plate is detachably affixable to one of two of said at least one is sidewall.

21. The reactor of claim 20, wherein a second annular plate is detachably affixable to the other of said two sidewalls to also partially close said throat.

22. The reactor of claim 20, wherein said plate is detachably affixable to both of said two sidewalls and includes a plurality of apertures therethrough in an area of said throat of said vault.

23. The reactor of claim 22, wherein said apertures are circular and arranged about said central axis.

24. The reactor of claim 22, wherein said apertures are elongated and arranged about said central axis with a short dimension radial to said central axis.

25. The reactor of claim 21, wherein said at least one sidewall comprises first and second sidewalls and said at least one magnet comprises a tubular first magnet assembly disposed behind said first sidewall and a cylindrical second magnet assembly disposed behind said second sidewall.

26. The reactor of claim 25, wherein said first and second magnet assemblies have opposed magnetic polarities along said central axis.

27. The reactor of claim 25, wherein said first and second magnet assemblies have same magnetic polarities along said central axis.

28. The reactor of claim 17, wherein said vault is cylindrical.

29. The reactor of claim 28, wherein said at least one magnet comprises a tubular magnet assembly having a magnetic polarity along said central axis.

30. The reactor of claim 17, wherein said plate includes at least one aperture with a minimum dimension of at least 1 cm.

31. The reactor of claim 30, wherein said plate includes a plurality of said apertures in an area of said throat of said vault.

32. The reactor of claim 17, further comprising a magnetron positioned in back of a roof of said vault opposite said throat and rotatable about said central axis.

33. The reactor of claim 32, wherein said magnetron comprises an unbalanced nested magnetron.

34. A hollow cathode magnetron sputter reactor, comprising:
a vacuum chamber arranged about a central axis;
a pedestal for supporting a substrate to be sputter coated;
a sputtering target in opposition to said pedestal and including at least one annular sidewall and a roof forming a vault symmetric about said central axis and having a throat facing said target, said target being continuous and not allowing differential electrical biasing between portions and said vault;
an annular plate positioned adjacent to and partially closing said throat;
a tubular magnet assembly of a first magnetic polarity along said central axis disposed in back of said sidewall; and
a roof magnetron positioned in back of said roof asymmetric about and rotatable around said central axis.

35. The reactor of claim 34, wherein said roof magnetron comprises an annular outer pole of said first magnetic polarity and an inner pole of an opposed, second magnetic polarity surrounded by said outer pole.

* * * * *